(12) United States Patent
Peng et al.

(10) Patent No.: US 8,318,030 B2
(45) Date of Patent: Nov. 27, 2012

(54) MAGNETIC DEVICE DEFINITION WITH UNIFORM BIASING CONTROL

(75) Inventors: Xilin Peng, Bloomington, MN (US); Stacey C. Wakeham, Bloomington, MN (US); Yifan Zhang, Eden Prairie, MN (US); Zhongyan Wang, San Ramon, CA (US); Konstantin R. Nikolaev, Edina, MN (US); Mark Henry Ostrowski, Lakeville, MN (US); Yonghua Chen, Edina, MN (US); Juren Ding, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 784 days.

(21) Appl. No.: 12/502,180

(22) Filed: Jul. 13, 2009

(65) Prior Publication Data

US 2011/0006033 A1    Jan. 13, 2011

(51) Int. Cl.
 *B44C 1/22* (2006.01)
(52) U.S. Cl. ............ 216/22; 216/67; 216/72; 216/75
(58) Field of Classification Search ................. None
 See application file for complete search history.

(56) References Cited

U.S. PATENT DOCUMENTS

| | | | |
|---|---|---|---|
| 6,024,885 A * | 2/2000 | Pendharkar et al. | 216/22 |
| 6,198,608 B1 * | 3/2001 | Hong et al. | 360/320 |
| 6,519,118 B2 * | 2/2003 | Chang et al. | 360/317 |
| 6,631,055 B2 * | 10/2003 | Childress et al. | 360/321 |
| 6,700,759 B1 | 3/2004 | Knapp et al. | |
| 6,861,177 B2 | 3/2005 | Pinarbasi et al. | |
| 6,956,774 B2 * | 10/2005 | Lung et al. | 365/185.28 |
| 6,989,971 B2 * | 1/2006 | Lin et al. | 360/322 |
| 7,037,847 B2 | 5/2006 | Le et al. | |
| 7,324,311 B2 | 1/2008 | Lee et al. | |
| 7,344,330 B2 | 3/2008 | Heim et al. | |
| 7,419,610 B2 | 9/2008 | Cyrille et al. | |
| 7,441,326 B2 | 10/2008 | Seyama et al. | |
| 7,713,755 B1 * | 5/2010 | Xiao et al. | 438/3 |
| 7,881,022 B2 * | 2/2011 | Takei et al. | 360/324.1 |
| 2008/0062584 A1 | 3/2008 | Freitag et al. | |
| 2008/0155810 A1 | 7/2008 | Hong et al. | |
| 2011/0006033 A1 * | 1/2011 | Peng et al. | 216/22 |

* cited by examiner

*Primary Examiner* — Allan Olsen
(74) *Attorney, Agent, or Firm* — Leanne Taveggia Farrell; Westman, Champlin & Kelly, P.A.

(57) ABSTRACT

A method of fabricating a magnetic device is described. A mask removing layer is formed on a layered sensing stack and a hard mask layer is formed on the mask removing layer. A first reactive ion etch is performed with a non-oxygen-based chemistry to define the hard mask layer using an imaged layer formed on the hard mask layer as a mask. A second reactive ion etch is performed with an oxygen-based chemistry to define the mask removing stop layer using the defined hard mask layer as a mask. A third reactive ion etch is performed to define the layered sensing stack using the hard mask layer as a mask. The third reactive ion etch includes an etching chemistry that performs at a lower etching rate on the hard mask layer than on the layered sensing stack.

20 Claims, 10 Drawing Sheets

MAGNETIC DEVICE DEFINITION WITH UNIFORM BIASING CONTROL

BACKGROUND

With the never-ending need to increase the recording density of storage devices, the size of magnetic devices or transducers are in constant need of shrinking.

Magnetic devices can be defined using ion beam etching (IBE) processes. Due to the non-volatile byproducts of IBE, often times side mill clean up steps are followed by device definition to remove undesirable re-deposited material. However, side milling can cause device edge damage. In addition, the shadowing effects and beam divergence of IBE processes can cause non-uniform material removal during device formation and can impact the magnetic device geometry and resulted performance of magnetic devices fabricated thereafter.

The discussion above is merely provided for general background information and is not intended to be used as an aid in determining the scope of the claimed subject matter.

SUMMARY

A method of fabricating a magnetic device includes forming a mask removing layer on a layered sensing stack and a hard mask layer is formed on the mask removing stop layer. The mask removing layer has a defined stop plane. A first reactive ion etch is performed with a non-oxygen-based chemistry to define the hard mask layer using a photo-resist layer as a mask. A second reactive ion etch is performed with an oxygen-based chemistry to define the mask removing stop layer using the defined hard mask layer as a mask. A third reactive ion etch is performed to define the layered sensing stack using the hard mask layer as a mask. The third reactive ion etch includes an etching chemistry that performs at a lower etching rate on the hard mask layer than on the layered sensing stack.

Further steps in fabricating the magnetic device include depositing an isolation material to cover free edges of the layered sensing stack, free edges of the mask removing layer and free edges of the hard mask layer. A hard biasing magnetic material is deposited on the isolation material. The hard mask, a portion of the biasing material and a portion of the isolation material are removed then at the defined stop plane.

These and various other features and advantages will be apparent from a reading of the following Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Embodiments of the disclosure pertain to processes for defining a magnetic device having a junction stack or layered sensing stack using reactive ion etching (RIE), which tends to form volatile byproducts instead of non-volatile byproducts and also provides uniform or symmetrical device formation.

Figure 1:
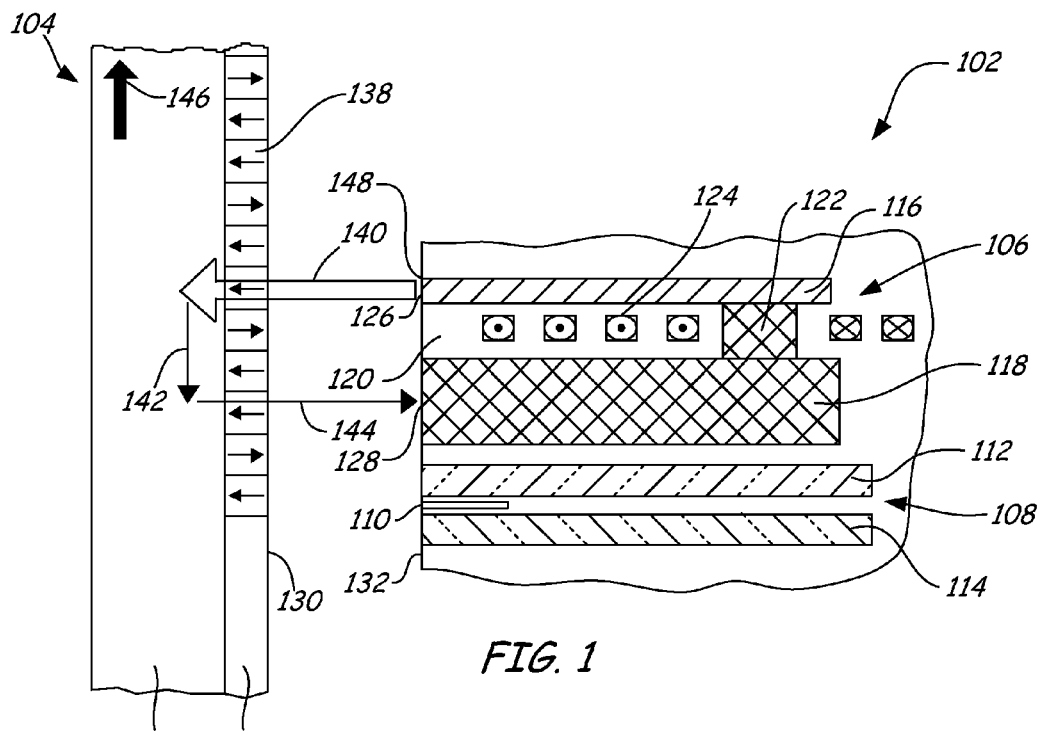
FIG. 1 illustrates a partial sectional view of an example read/write transducer for perpendicular recording to a medium.

Before discussing details of the embodiments of the disclosure, a discussion pertaining to magnetic devices is provided. FIG. 1 illustrates a partial sectional view of one example read/write transducer 102 for perpendicular recording data to a medium 104. It should be realized that other configurations are possible. In FIG. 1, all spacing and insulating layers are omitted for clarity. Read/write transducer 102 includes a writing element 106 and a reading element 108 formed on a trailing edge of a slider (not shown). Reading element 108 is a magnetic device that includes a read sensor 110 that is spaced between a top shield 112 and a bottom shield 114. Top and bottom shields 112 and 114 operate to isolate read sensor 110 from external magnetic fields that could affect sensing bits of data that have been recorded on medium 104.

Writing element 106 is a magnetic device that includes a writing main pole (or write pole) 116 and a return pole 118. Main and return poles 116 and 118 are separated by a non-magnetic spacer 120. Main pole 116 and return pole 118 are connected at a back gap closure 122. A conductive coil 124 extends between main pole 116 and return pole 118 and around back gap closure 122. An insulating material (not shown) electrically insulates conductive coils 124 from main and return poles 116 and 118. Main and return poles 116 and 118 include main and return pole tips 126 and 128, respectively, which face a surface 130 of medium 104 and form a portion of an air bearing surface (ABS) 132 of a slider. FIG. 1 illustrates reading element 108 having separate top and bottom shields 112 and 114 from writing element 206. However, it should be noted that in other read/write transducers, return pole 118 could operate as a top shield for reading element 108.

A magnetic circuit is formed in writing element 106 by return pole 118, back gap closure 122, main pole 116, and a soft magnetic layer 134 of medium 104 which underlay a hard magnetic or storage layer 136 having perpendicular orientation of magnetization. Storage layer 136 includes uniformly magnetized regions 138, each of which represent a bit of data in accordance with an up or down orientation. In operation, an electrical current is caused to flow in conductive coil 124, which induces a magnetic flux that is conducted through the magnetic circuit. The magnetic circuit causes the magnetic flux to travel vertically through the main pole tip 126 and storage layer 136 of the recording medium, as indicated by arrow 140. Next, the magnetic flux is directed horizontally through soft magnetic layer 134 of the recording medium, as indicated by arrow 142, then vertically back through storage layer 136 through return pole tip 128 of return pole 118, as indicated by arrow 144. Finally, the magnetic flux is conducted back to main pole 116 through back gap closure 122.

Main pole tip 126 is shaped to concentrate the magnetic flux traveling there through to such an extent that the orientation of magnetization in patterns 138 of storage layer 136 are forced into alignment with the writing magnetic field and, thus, cause bits of data to be recorded therein. In general, the magnetic field in storage layer 136 at main pole tip 126 must be twice the coercivity or saturation field of that layer.

Medium 104 moves in the direction indicated by arrow 146. A trailing edge 148 of main pole 116 operates as a "writing edge" that defines the transitions between bits of data recorded in storage layer 136, since the field generated at that edge is the last to define the magnetization orientation in the pattern 138.

Figure 2:
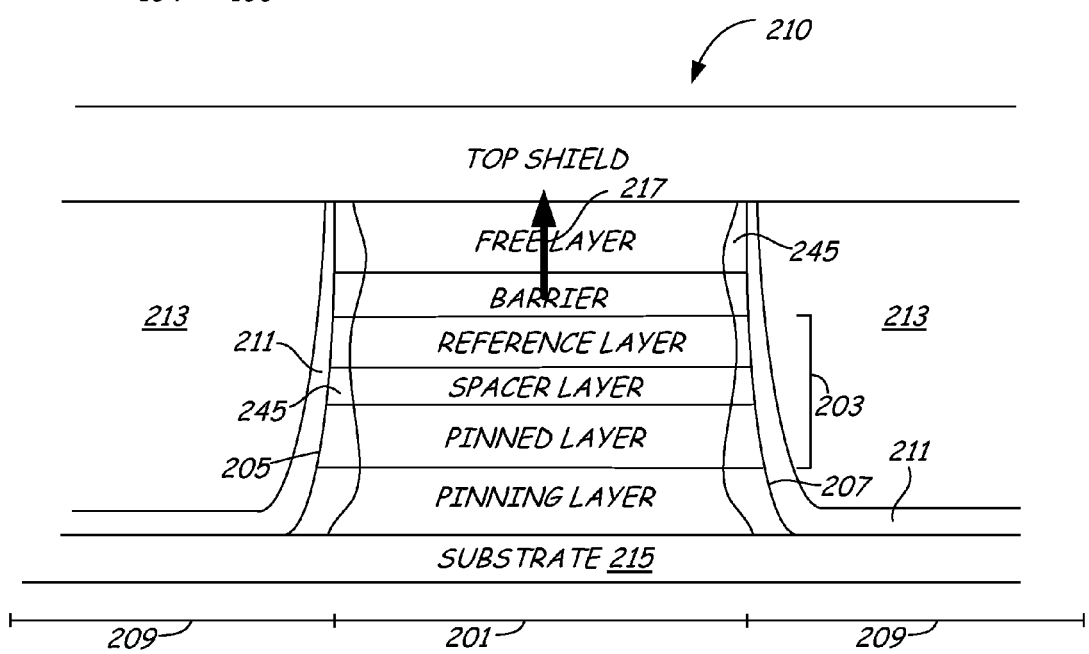
FIG. 2 illustrates a diagrammatic air bearing surface view of one embodiment of a reader sensor.

FIG. 2 is diagrammatic air bearing surface (ABS) view of a magnetic device 210, similar to the read sensor 110 illustrated in FIG. 1, under one embodiment. Sensor 210 includes a substrate 215. Sensor 210 includes active region 201 and passive region 209. Active region 201 contains a multiple-layered sensor stack or junction stack. The layered sensor stack includes sidewalls 205 and 207. Passive region 209 is the region that surrounds the layered sensor stack on sidewalls 205 and 207.

In one embodiment of the active region 201, sensor stack includes a seed layer (not specifically illustrated in FIG. 2), a pinning layer, a pinned layer, a spacer layer, a reference layer, a barrier layer, a free layer and a capping layer. The pinned layer is positioned on and exchange coupled with the underlying pinning layer. Pinned layer includes a magnetic moment or magnetization direction that is substantially prevented from rotating in the presence of applied magnetic fields. Pinned layer can comprise a ferromagnetic material, while pinning layer can comprise an antiferromagnetic material. Other materials having similar properties are also possible.

In the FIG. 2 embodiment, the pinned layer, spacer layer and reference layer together can be considered a synthetic antiferromagnet (SAF) 203. SAF 203 includes two soft ferromagnetic layers (the pinned layer and the reference layer) separated by the spacer layer, which can be a metal such as ruthenium (Ru) or rhodium (Rh). The reference layer is the layer closest to the free layer. The exchange coupling between pinned layer and the reference layer is an oscillatory function of the thickness of spacer layer. The barrier layer is positioned between the reference layer and free layer. The free layer can comprise a ferromagnetic material and is considered the "sensing" layer. The free layer has a magnetization direction that is substantially free to rotate in the presence of externally applied magnetic fields.

Each passive region 209 of sensor 210 includes an insulating layer or isolation layer 211, biasing layer 213, such as a permanent magnet or any other material that provides a bias, and other seed and cap or protective layers (not shown). Insulating layer 211 surrounds the layered sensor stack or active region 201 of sensor 210. However, insulating layer 211 needs to at least surround the barrier layer. Sensor 210 includes a tunneling sensor current 217 that flows perpendicular to the stack length and through the barrier layer (one skilled in the art will appreciate that current can also be applied in a direction opposite from the direction illustrated in FIG. 2) or in other directions. The barrier layer needs to be insulated by a thick enough insulating layer to prevent current 217 from leaking into biasing layer 213, for example. An example insulating material includes aluminum oxide ($Al_2O_3$). However, other types of oxide and non-oxide materials with similar properties are possible.

To properly bias and yet still allow the free layer to rotate in response to magnetic fields, hard bias layer 213 is formed on opposing sides of at least the free layer of sensor 210. Bias layer 213 is configured to induce a uniform pinning or biasing field across the free layer. The bias layer 213 is illustrated as being formed on opposing sides of the active region 201 of each sensor stack and placed outside of insulating material 211. However, bias layer 213 can be formed on opposing sides of at least the free layer of sensor 210. The bias layer 213 is configured to bias the free layer at edges (i.e. sides 205, 207) of the free layer to eliminate domain edges and at the same time leave a small field at the center of the free layer.

In the conventional fabrication of sensor 210, the layers of active region 201 are formed on substrate 215. Then, the sensor stack is photo patterned to a desired critical dimension and ion beam etched (IBE) to define sidewalls 205 and 207. However, due to the non-volatility of IBE byproducts, a metallic layer can form over free edges of the layered sensing stack causing electrical shorting of the magnetic device. A subsequent side mill cleaning step usually follows IBE device definition to remove this re-deposited material across the barrier layer. Unfortunately, side milling can cause edge damage, especially problematic in magnetic devices having a small critical dimension. In addition, after device definition, the photo resist used to pattern the device definition is at a height larger than the critical dimension thus causing a shadowing effect when depositing the bias layer or permanent magnet 213. The shadowing effect can cause the bias layer to have an uneven profile (i.e., asymmetric), which impacts the magnetic performance of the sensor. Although FIGS. 1 and 2 describe particular types of magnetic devices (i.e., read and write transducers), these types of magnetic devices are merely example. It should be understood that embodiments of the disclosure can also pertain to other types of magnetic devices.

Figure 3:
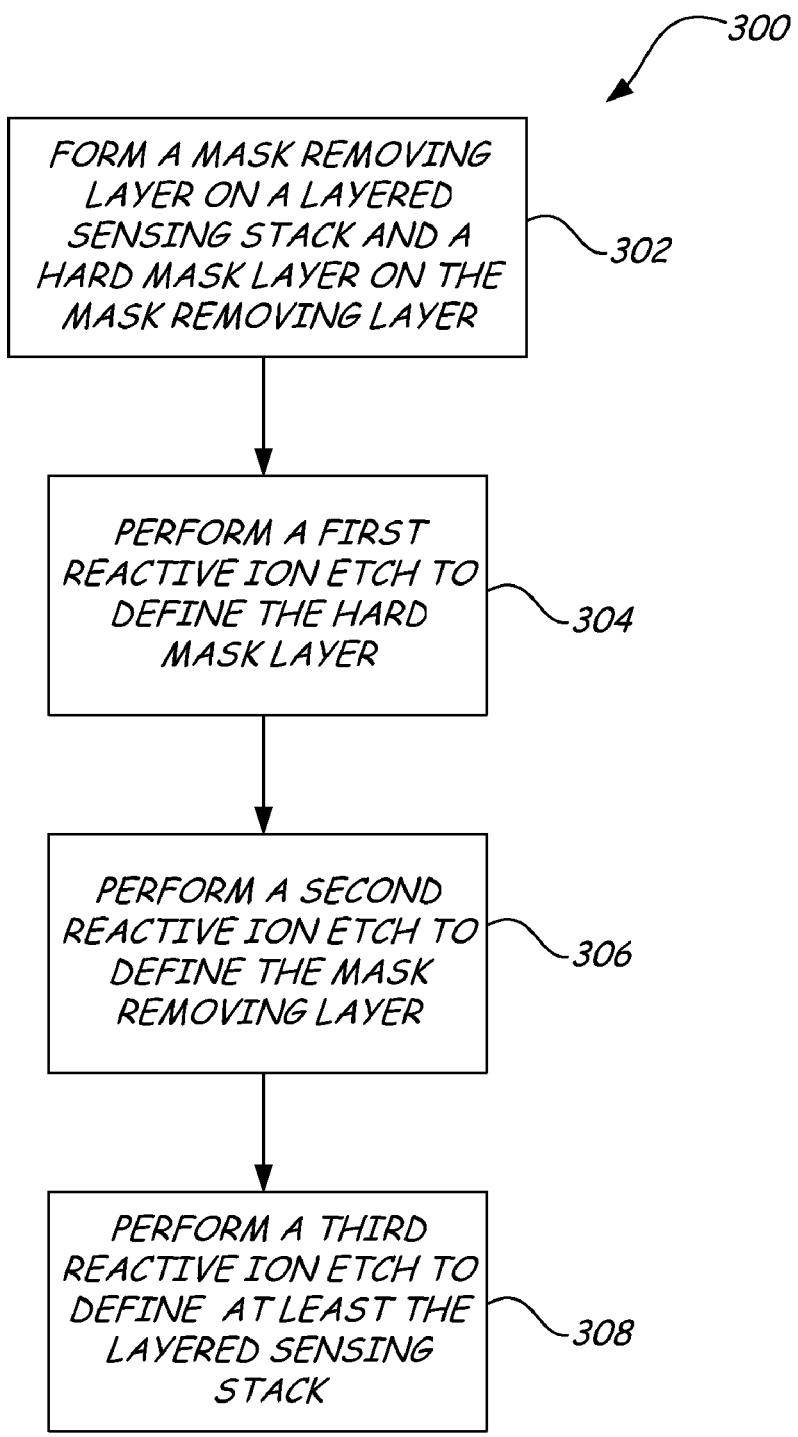
FIG. 3 is a flowchart illustrating a method of fabricating a magnetic device.

FIG. 3 is a flow chart 300 illustrating a method of fabricating a magnetic device. The method described in FIG. 3 avoids the drawbacks of conventional IBE. The method includes defining a junction stack or layered sensing stack by using a reactive ion etch (RIE). The RIE of the layered sensing stack forms more volatile etching byproducts and therefore does not require a side mill to clear re-deposited material. In addition, a metallic hard mask is used such that the photo resist can be removed after the hard mask is defined. The overall hard mask height is shorter than the photo resist and, therefore, enables reduced shadowing effects during bias layer formation and enables more uniform biasing layer thickness adjacent to the junction wall.

Figures 4, 5:
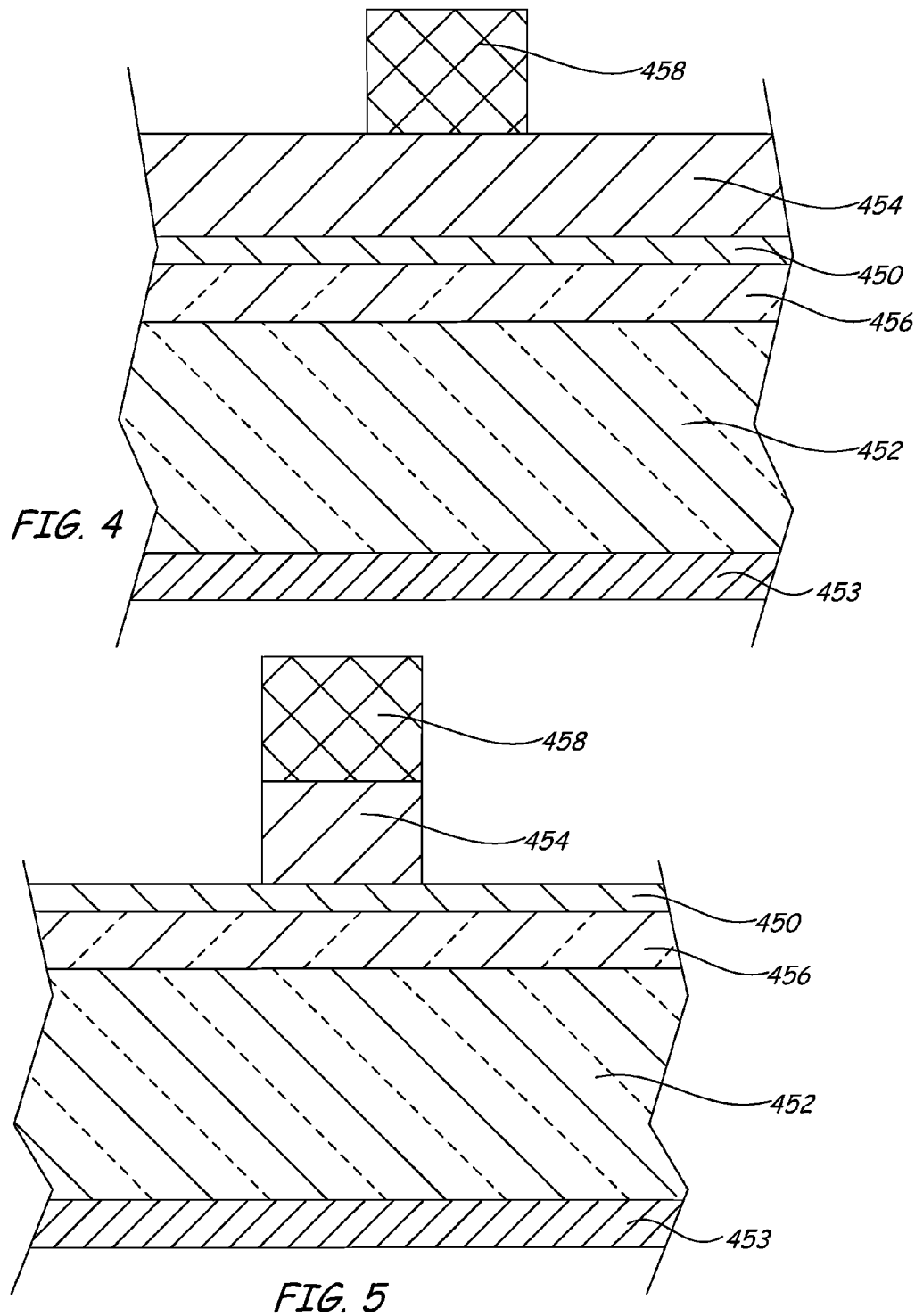
FIGS. 4-9 are a series of diagrams illustrating the method described in FIG. 3.

At block 302 and as illustrated in the diagram illustrated in FIG. 4, a mask removing layer 450 is formed on a layered sensing stack or junction 452, which is formed on a seed layer 453. Mask removing layer 450 will be used as a stop layer for later removal of an isolation layer, biasing layer and the hard mask layer by, for example, chemical mechanical polishing (CMP). For example, mask removing layer 450 can be amorphous carbon, a metal carbide, nitride, ruthenium (Ru), chromium (Cr) and a combinations thereof with a soft detachment layer or other material having a low etch or chemical mechanical polishing rate. A hard mask layer 454 is then formed on the mask removing layer 450. For example, hard mask layer 454 can be a metal, such as tantalum (Ta), titanium (Ti), tantalum nitride (TaN) or titanium nitride (TiN). An example seed layer 453 includes tantalum (Ta).

In particular, a protective or capping layer 456 is formed between the layered sensing stack 452 and the mask removing layer 450. Protective or capping layer 456 protects the free layer in layered sensing stack 452 from the subsequent exposure to unwanted environments during various materials deposition. Example materials for protective layer 456 include Ru, nickel iron (NiFe), Cr or combinations thereof. In FIG. 4, an imaged layer 458 is formed on hard mask layer 454. Imaged layer 458 can be a patterned photo resist for use in defining hard mask layer 454.

At block 304 and as illustrated in FIG. 5, a first reactive ion etch (RIE) is performed to define hard mask layer 454. More specifically, an image from the imaged layer 458 is transferred to the hard mask layer 454 using a non-oxygen based RIE. As illustrated in FIG. 5, the first RIE "opens" the hard mask layer 454 to the layers underneath—opens the hard mask layer to mask removing layer 450. For example, the first RIE can be a fluorine-based etch or a chlorine-based etch. Examples of fluorine-based chemistries or fluorine-based ion species include carbon tetrafluoride ($CF_4$), carbon hydrotrifluoride ($CHF_3$), octafluorocyclobutane ($C_4F_8$) and sulfur hexafluoride ($SF_6$). Examples chlorine-based chemistries or chlorine-base ion species include hydrochloric acid (HCl), chlorine ($Cl_2$) and boron trichloride ($BCl_3$).

Figure 6:
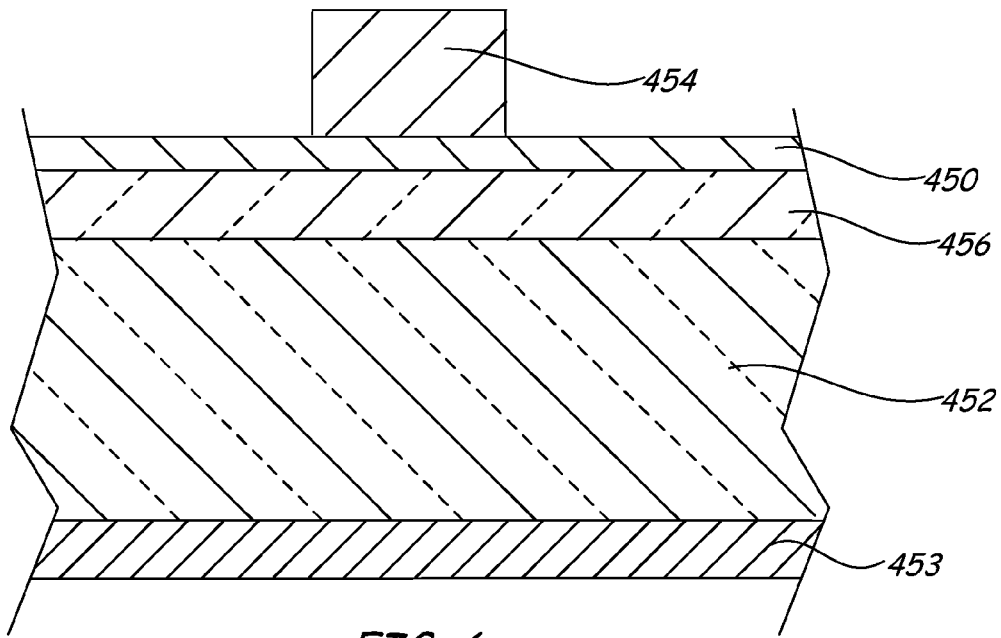

In FIG. 6 and in one embodiment, leftover imaged layer 458 can be removed to leave seed layer 453, layered sensing stack 452, protective layer 456, mask removing layer 450 and the remaining portion of hard mask layer 454 after performance of the first RIE. For example, oxygen ($O_2$) plasma can be used to strip off the leftover imaged layer 458 when the imaged layer is a photo resist. However, it should be realized that other methods of removing leftover imaged layer 458 are possible.

Figure 7:
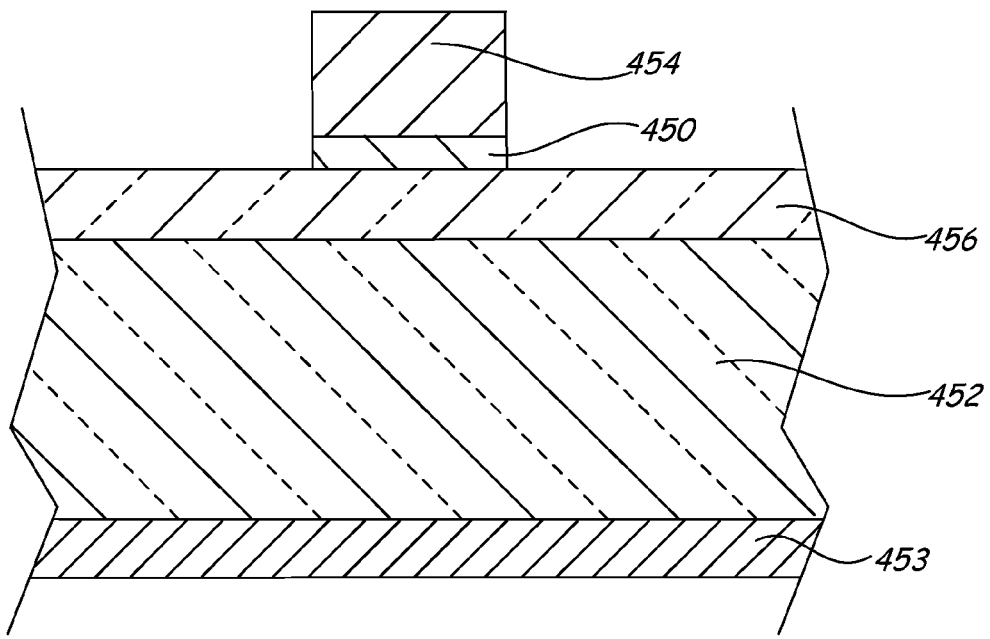

At block 306 and as illustrated in FIG. 7, a second reactive ion etch (RIE) is performed to define mask removing layer 450. More specifically, an oxygen-based RIE is used to define mask removing layer 450 using the remaining portion of hard mask layer 454. As illustrated in FIG. 7, the second RIE "opens" the mask removing layer 450 to the layers underneath—open the mask removing layer to protective layer 456, layered sensing stack 452 and seed layer 453. For example, the second RIE can use oxygen-based chemistry or oxygen-based ion species, such as oxygen ($O_2$), a combination of $O_2$ and helium (He) or a combination of $O_2$ and argon (Ar). In addition, the second RIE removal of layer 450 can be combined with the removal of imaging layer 458.

Figure 8:
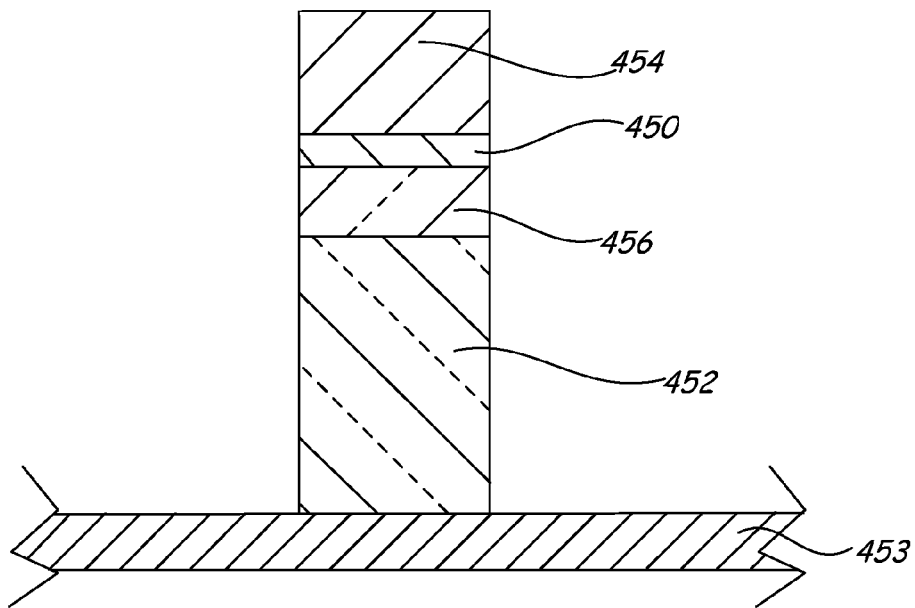
Figure 9:
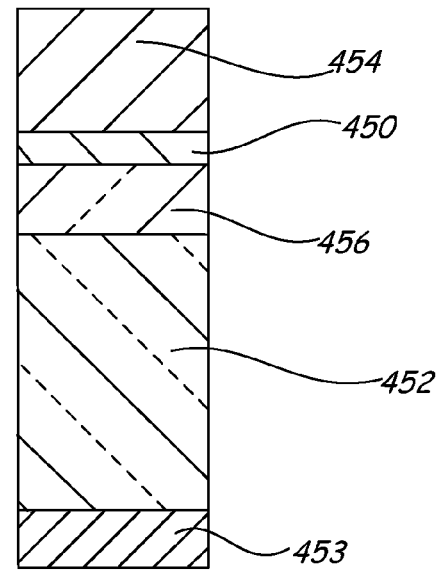

At block 308 and as illustrated in FIG. 8, a third reactive ion etch (RIE) is performed to define at least the layered sensing stack 452 and protective layer 456. More specifically, a methanol-based RIE is used to define protective layer 456 and layered sensing stack 452 using the remaining portion of hard mask layer 454 as a mask. A methanol-based RIE does not etch hard mask layer 454 in methanol-based RIE chemistry, i.e. it has a lower etching rate on the hard mask than that of the layered sensing stack 452 and protective layer 456. As illustrated in FIG. 8, the third RIE "opens" the protective layer 456 and layered sensing stack 452 to the seed layer 453. For example, the third RIE can use methanol-based chemistry or methanol-based ion species, such as methanol ($CH_3OH$ or other CO-based chemistries, such as $CO/NH_3$ and etc. In one embodiment and as illustrated in FIG. 9, the portions of seed layer 453 not positioned under the remaining hard mask layer 454 can be removed or cleared, for example, using an additional ion beam etch (IBE) or argon (Ar) plasma clean.

Figure 10:
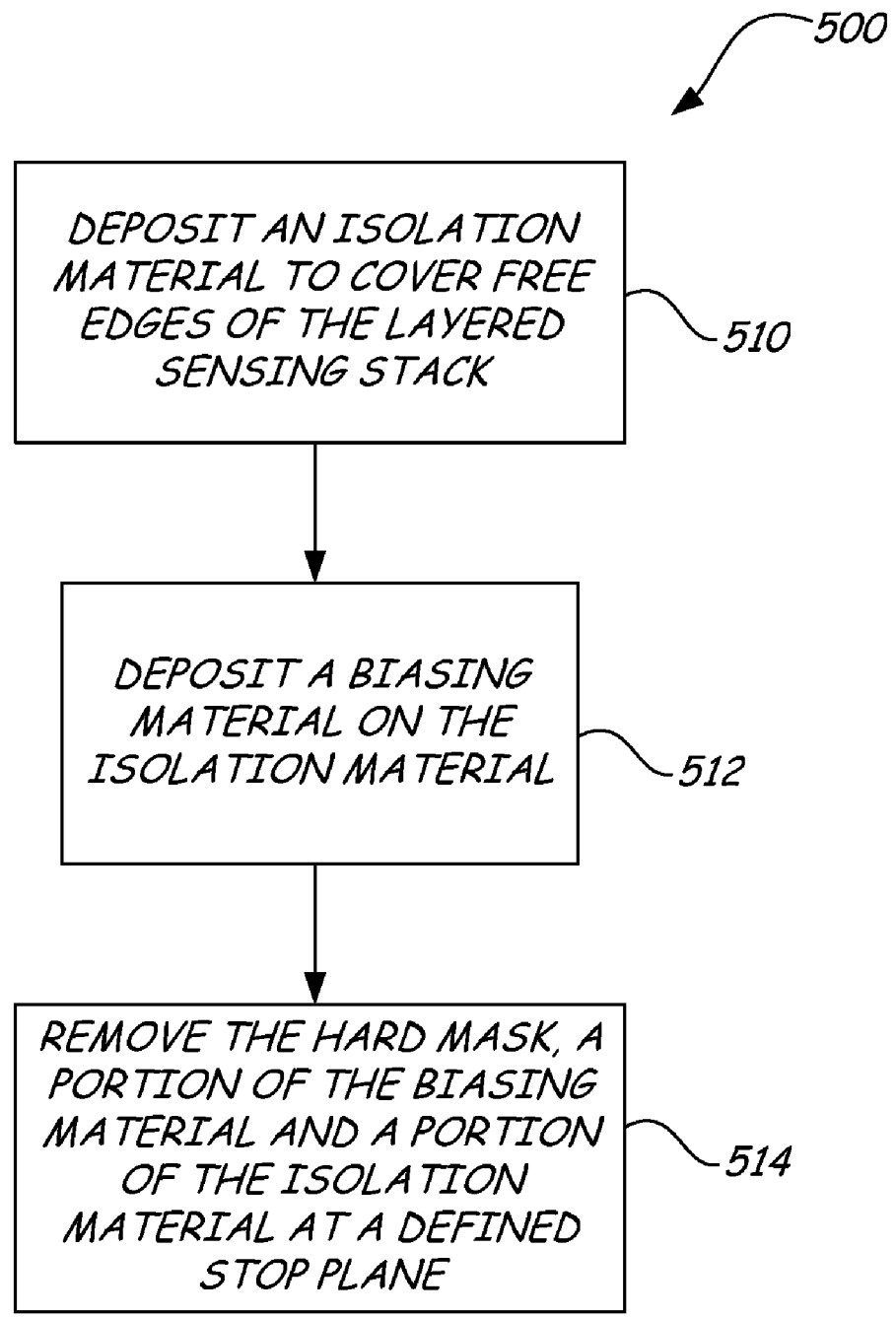
FIG. 10 is a flowchart illustrating further steps in fabricating a magnetic device.
Figure 11:
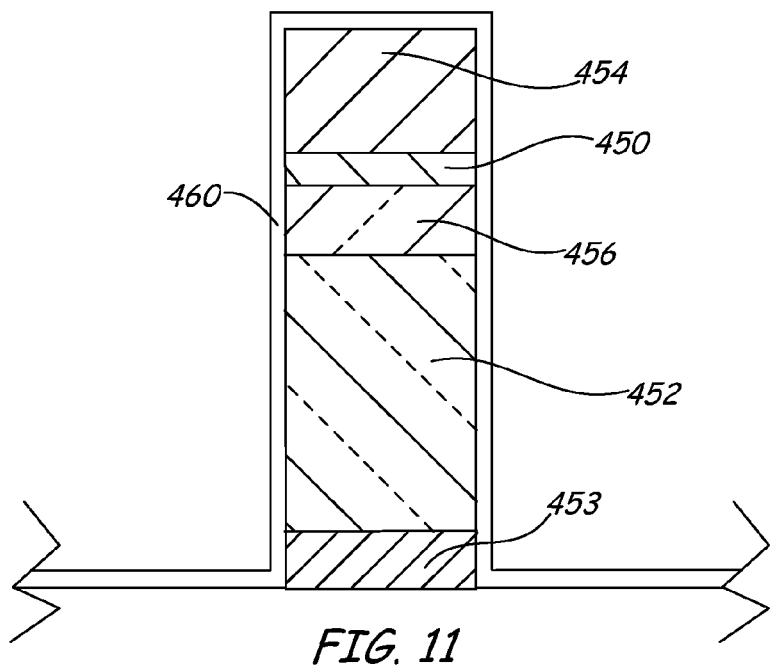
FIGS. 11-17 are a series of diagrams illustrating the method described in FIG. 10.

FIG. 10 is a flow chart 500 illustrating further steps in the method of fabricating a magnetic device. At block 510 and as illustrated in FIG. 11, an isolation material 460 is deposited on the magnetic device to cover free edges of each of the remaining portions of seed layer 453, layered sensing stack 452, protective layer 456, mask removing layer 450 and hard mask layer 454. Deposition of the isolation material 460 minimizes the exposure of the defined layered sensing stack 452 to ambient conditions to prevent degradation of sensing performance. Isolation material 460 can be an oxide insulator, such as aluminum oxide ($Al_2O_3$) or a non-oxide insulator, such as nitrides and carbides (i.e., silicon nitride (SiN) and aluminum nitride (AlN)). In addition, in one embodiment, oxygen plasma surface passivation can be used prior to depositing isolation material 460.

Figure 12:
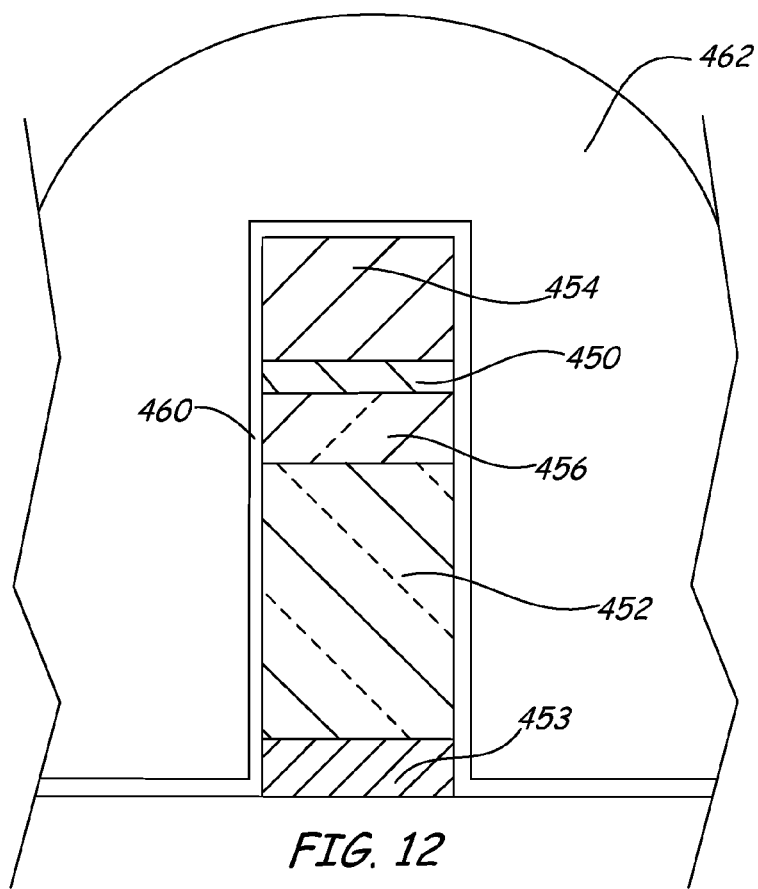

At block 512 and as illustrated in FIG. 12, a biasing material 462 is deposited on isolation material 460. Biasing material or permanent magnet 462 is deposited in a high vacuum environment by ion beam deposition (IBD) or physical vapor deposition via sputtering. After biasing material deposition, the sensor area defined by hard mask layer 454 is masked out so as to mill the field area of biasing material 462.

Figure 13:
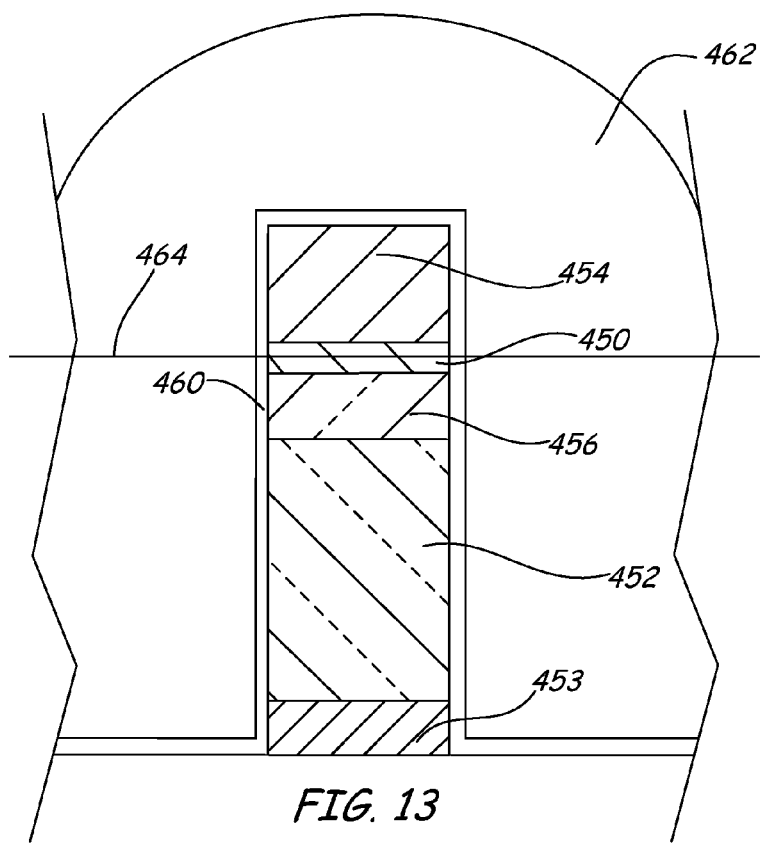
Figure 14:
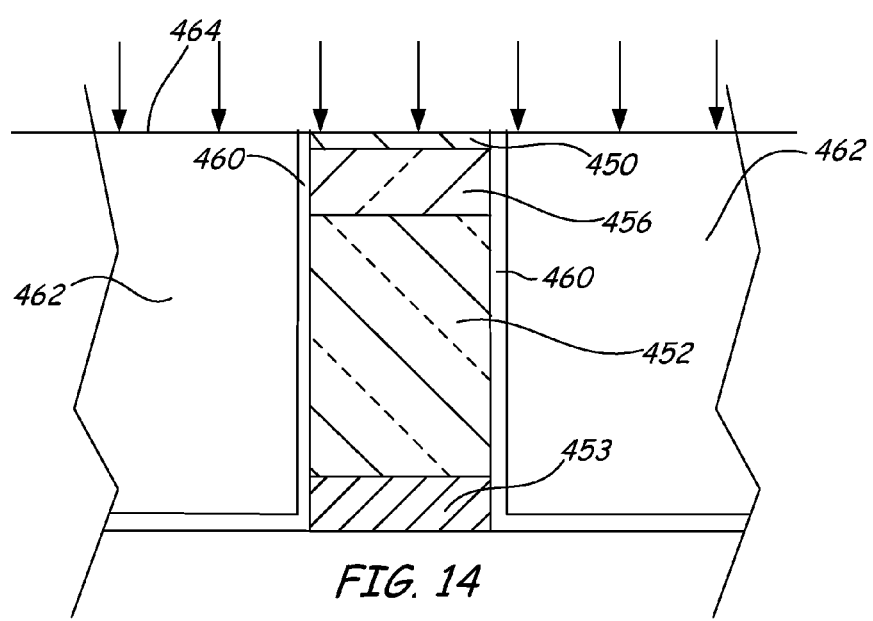

At block 514 and as illustrated in FIG. 13, after milling of the field area, a process is performed to remove hard mask layer 454, a portion of biasing material 462 and a portion of isolation material 460 at a defined stop plane 464 within the mask removing layer 450. As illustrated in FIG. 14, a chemical mechanical polish (CMP) is performed up until the stop plane 464 to remove hard mask layer 454 and portions of biasing material 462 and isolation material 462 that are located above layered sensing stack 452.

Figure 15:
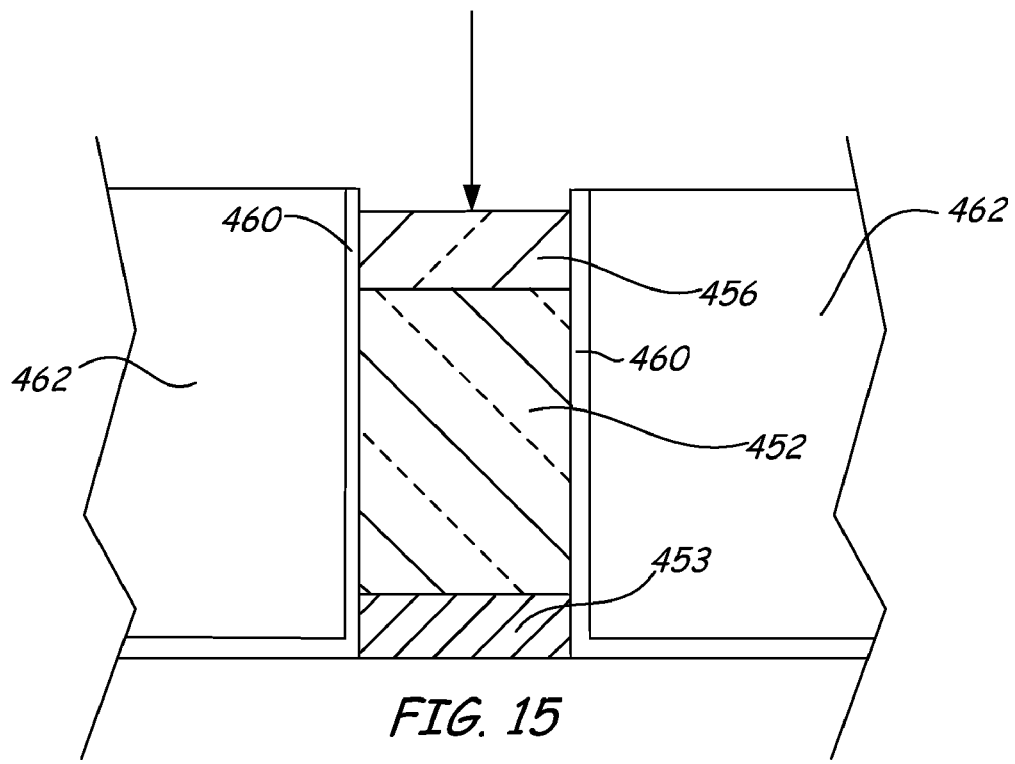
Figure 16:
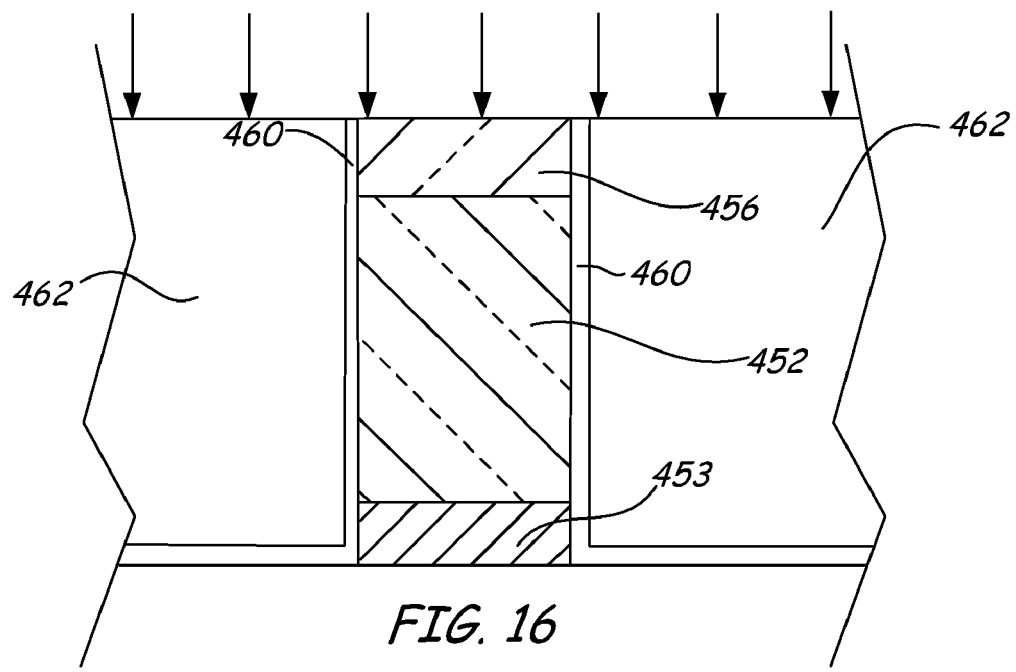

As illustrated in FIG. 15, the remaining portion of mask removing layer 450 can be ashed out. In one embodiment and as illustrated in FIG. 16, a second CMP or other type of gentle ion etch is performed to remove any surface contamination or residual to thereby make better electrical contact or better shield to shield space control before depositing a top shield seed layer and top shield.

Figure 17:
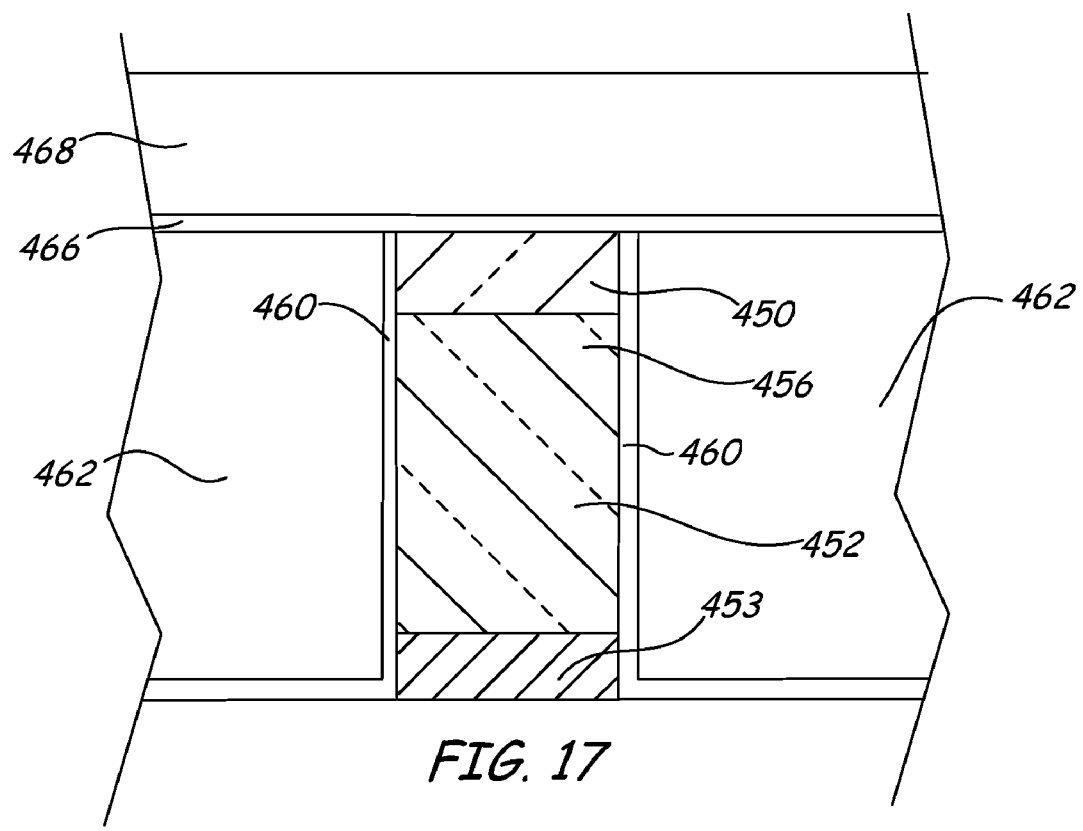

As illustrated in FIG. 17, a top shield seed layer 466 and a top shield or top contact 468 are deposited onto what has been formed of the sensor. Seed layer 466 can be tantalum (Ta) or nickel iron (NiFe) and top shield 468 can be NiFe or other soft magnetic materials.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of fabricating a magnetic device comprising:
   forming a layered sensing stack, a mask removing layer on the layered sensing stack and a hard mask layer on the mask removing layer;
   performing a first reactive ion etch with a non-oxygen-based chemistry to define the hard mask layer using an imaged layer formed on the hard mask layer as a mask;
   performing a second reactive ion etch with an oxygen-based chemistry to define the mask removing layer using the defined hard mask layer as a mask; and
   performing a third reactive ion etch to define the layered sensing stack using the hard mask layer as a mask, the third reactive ion etch including an etching chemistry that etches at a lower etching rate on the hard mask layer than on the layered sensing stack.

2. The method of claim 1, wherein performing the third reactive ion etch comprises performing the third reactive ion etch with one of a methanol-based chemistry and carbon oxide-based chemistry which are able to form volatile byproducts with magnetic stack layers.

3. The method of claim 1, wherein performing the second reactive ion etch using an oxygen-based chemistry to define the mask removing layer further removes the imaged layer.

4. The method of claim 1, further comprising stripping the imaged layer using oxygen plasma.

5. The method of claim 1, wherein the mask removing layer comprises one of amorphous carbon, ruthenium, chromium, and a combinations thereof with a soft detachment layer.

6. The method of claim 1, wherein the hard mask layer is a metallic material comprising one of a tantalum, titanium, tantalum nitride and titanium nitride.

7. The method of claim 1, wherein performing the first reactive ion etch using a non-oxygen-based chemistry comprises performing the first reactive ion etch using a fluorine-based ion species.

8. The method of claim 7, wherein the fluorine-based species comprises one of carbon tetrafluoride ($CF_4$), carbon hydrotrifluoride ($CHF_3$), octafluorocyclobutane ($C_4F_8$) and sulfur hexafluoride ($SF_6$).

9. The method of claim 1, wherein performing the first reactive ion etch using a non-oxygen-based chemistry comprises performing the first reactive ion etch using a chlorine-based ion species.

10. The method of claim 9, wherein the chlorine-based species comprises one of hydrochloric acid (HCl), chlorine ($Cl_2$) and boron trichloride ($BCl_3$).

11. The method of claim 1, further comprising forming a protective layer on the layered sensing stack between a free layer of the sensing stack and the mask removing layer.

12. The method of claim 11, wherein the protective layer comprises one of ruthenium and nickel iron, ruthenium, chromium and combinations thereof.

13. A method of fabricating a magnetic device comprising:
performing a reactive ion etch to define a layered sensing stack using a defined mask removing layer positioned on the layered sensing stack and a defined hard mask layer located on the mask removing layer as a mask, the mask removing layer providing a stop plane and the reactive ion etch including an etching chemistry that etches the hard mask layer at a lower etching rate than on the layered sensing stack;
depositing an isolation material to cover free edges of the layered sensing stack, free edges of the mask removing layer and free edges of the hard mask layer;
depositing a biasing material on the isolation material; and
removing the hard mask, a portion of the biasing material and a portion of the isolation material at the defined stop plane.

14. The method of claim 13, wherein performing the reactive ion etch to define the layered sensing stack comprises performing the reactive ion etch with a methanol-based chemistry.

15. The method of claim 13, further comprising ashing away any remaining mask removing layer.

16. The method of claim 13, wherein the mask removing layer is defined by an oxygen-based reactive ion etch.

17. The method of claim 13, wherein the hard mask layer is defined by a non-oxygen based reactive ion etch.

18. A method of fabricating a magnetic device comprising:
forming a junction stack having at least one pinned layer and a free layer;
forming a mask removing layer on the junction stack and a hard mask layer on the mask removing layer, the mask removing layer providing a stop plane;
providing an imaged photoresist layer on the hard mask layer;
performing a first reactive ion etch to define the hard mask layer using the imaged photoresist layer as a mask;
performing a second reactive ion etch to define the mask removing layer using the defined hard mask layer as a mask;
performing a third reactive ion etch to define free edges of the junction stack using the hard mask layer as a mask; and
depositing an isolation material to cover free edges of the junction stack, free edges of the mask removing layer and free edges of the hard mask layer;
depositing a biasing material on the isolation material; and
removing the hard mask, a portion of the biasing material and a portion of the isolation material at the defined stop plane.

19. The method of claim 18, wherein the first reactive ion etch is performed with a non-oxygen based ion species and the second reactive ion etch is performed with an oxygen-based ion species.

20. The method of claim 18, wherein the third reactive ion etch is performed with a methanol-based ion species that etches on the hard mask layer at a lower etching rate than on the junction stack.

* * * * *